May 22, 1956 W. R. KOCH 2,747,111

COUPLING CIRCUIT FOR SEMI-CONDUCTOR DEVICES

Filed July 2, 1953

INVENTOR.
Winfield R. Koch

BY H. L. Newton

ATTORNEY

United States Patent Office 2,747,111

Patented May 22, 1956

2,747,111

COUPLING CIRCUIT FOR SEMI-CONDUCTOR DEVICES

Winfield R. Koch, Marlton, N. J., assignor to Radio Corporation of America, a corporation of Delaware Application July 2, 1953, Serial No. 365,709

10 Claims. (Cl. 307—88.5)

The present invention relates generally to direct current semi-conductor circuits and particularly to coupling means therefor.

In signal conveying circuits it is necessary to transmit signal information in the nature of potential or current variations from one part of the circuit to another. In circuits which are adapted to convey signal information of low frequency or in the nature of direct current variations, the problem of signal transmission without undue distortion is increased due to the limitations imposed by conventional coupling arrangements such as resistor-capacitor networks or transformers. Further since each additional stage of amplification requires energizing potential usually supplied from a common source, the problems of voltage drift and insulation arise. Negative feedback is helpful in reducing voltage drift but the difficulties of cascading direct current amplifier stages generally require the designer to minimize the total number of stages utilized.

One method of overcoming this difficulty is shown in U. S. Patent 1,927,755 issued September 19, 1933, to W. Rogowski et al., for "Method of Transmitting Electric Potentials" which discloses the use of a gaseous discharge device as a coupling device between cascaded amplifier stages employing electron discharge devices. Further information concerning gaseous discharge devices as coupling elements between electron discharge devices is disclosed by Iannone and Baller in "Electronics," October 1946, pages 106–107 in an article entitled "Gas Tube Coupling for D.-C. Amplifiers."

Gaseous discharge devices generally require operating voltages far in excess of the voltage differences existing in circuits incorporating semi-conductor devices such as transistors as the amplifier element. Accordingly the circuits disclosed in the above identified patent and article cannot be utilized in amplifier circuits incorporating transistors.

It is, therefore, an object of the present invention to provide an improved signal conveying coupling circuit for semi-conductor devices.

It is a further object of the present invention to provide an improved signal conveying coupling circuit adapted to couple cascade amplifier stages incorporating semi-conductor devices.

It is another object of the present invention to provide an improved coupling circuit adapted to provide efficient signal coupling between the electrodes of a semi-conductor device.

It is a still further object of the present invention to provide an improved coupling circuit utilizing gaseous discharge devices as coupling elements in a circuit employing semi-conductor devices.

It is still another object of the present invention to provide an improved coupling circuit utilizing a diode device as the coupling element between the electrodes of a semi-conductor device.

In accordance with one aspect of the present invention, a pair of semi-conductor devices are arranged in cascade and adapted to convey signal information in the nature of direct current variations. The coupling means between the cascade coupled stages comprises a pair of gaseous discharge devices serially coupled in opposed relation between the electrodes of the semi-conductor devices, and the source of direct current energizing potential is connected to the junction of the two gaseous discharge devices. Accordingly only the algebraic sum of the voltage drop of the two gaseous discharge devices appears between the output electrode of the first semi-conductor device and the input electrode of the second semi-conductor device.

In accordance with another aspect of the present invention, a pair of gaseous discharge devices connected in opposed relation or a semi-conductor diode such as a silicon diode having sharply defined characteristics may be connected between the collector electrode and the emitter electrode of a semi-conductor device utilized in a relaxation oscillator circuit such as a flip-flop circuit to provide efficient alternating current coupling between these electrodes.

The novel features that are considered characteristic of this invention are set forth with particularity in the appended claims. The invention itself, however, both as to its organization and method of operation, as well as additional objects and advantages thereof, will best be understood from the following description when read in connection with the accompanying drawing, in which:

Figure 1:
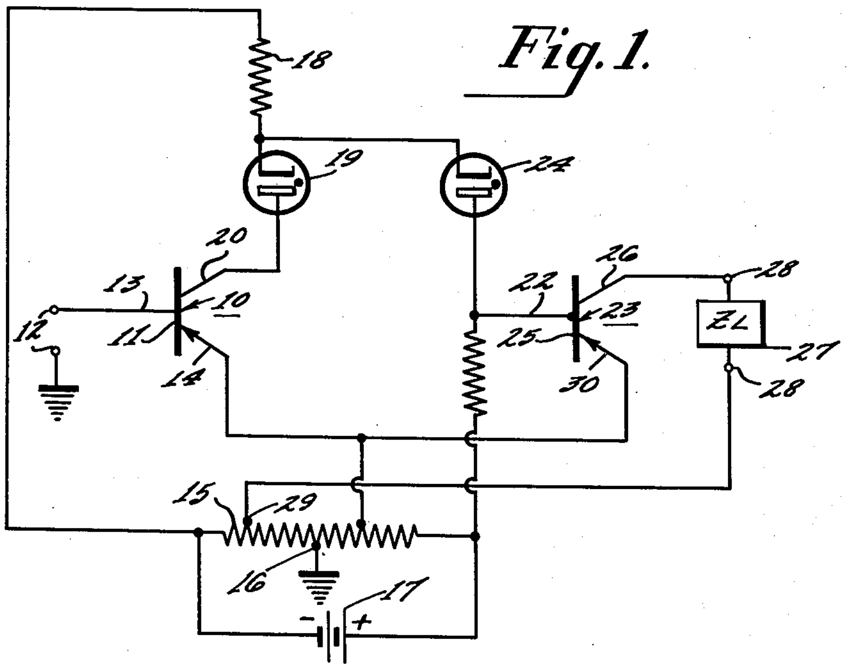
Figure 1 is a schematic circuit diagram of a pair of semi-conductor amplifier stages adapted in accordance with the present invention to provide direct current amplification.

Referring now to the drawing wherein like reference characters are used to designate like elements throughout the various figures and particularly to the amplifier circuit shown in Figure 1, a transistor 10 is provided as the first amplifier device. This transistor may be of the point contact type or of the junction type. It comprises a semi-conductive body 11 which may be of either conductivity type that is it may be of the P-N-N junction type or it may be of the N type point contact type.

Input signals from a suitable signal source may be applied to the input terminals 12 one of which is connected directly to the base electrode 13 and the other of which may be connected to a point of fixed reference potential such as chassis ground. The input circuit is completed to the emitter electrode 14 through a portion of a voltage dividing resistor 15 having a tap 16 also connected to ground.

Energizing potentials for the circuit may be provided from a source of direct current voltage illustrated as a battery 17 which is connected in shunt with the voltage dividing resistor 15. An energizing potential or bias voltage may be provided for the collector electrode circuit by means of a voltage dropping resistor 18 and a diode illustrated as a gaseous discharge device 19 connected serially between the collector electrode 20 and the negative terminal of the battery 17.

Signal energy which is developed in the collector electrode circuit of the transistor 10 is coupled to the base electrode 22 of a second or driven transistor 23 by means of a second diode device illustrated as a gaseous discharge device 24 connected directly between the base electrode 22 and the junction of the first gaseous discharge device 19 and the voltage dropping resistor 18.

The second transistor 23 comprises a semi-conductive body 25 of the same conductivity type as the semi-conductive body 11. In this manner bias voltages may be applied to the two transistors 10 and 23 from the same source of direct current energizing potential such as the battery 17.

Accordingly a direct current bias voltage may be provided for the collector electrode 26 through a load impedance illustrated as a rectangle 27 containing the legend $Z_L$ connected between a pair of output terminals 28, one of which is connected to the collector electrode 26 and the other of which is connected to a tap 29 on the voltage divider resistor 15. The emitter electrode 30 is connected directly to the emitter electrode 14. The input circuit for the transistor 23 is completed by a biasing resistor 31 which is connected between the base electrode 22 and the positive terminal of the battery 17.

A gaseous discharge device essentially differs in its behavior from a pure resistance in that the relation between current and voltage is not linear. It is a particular property of a gaseous discharge device that the potential remains substantially unchanged within a predetermined range of operation. If within this range of operation a direct current and an alternating current superposed thereon are applied to a gaseous discharge device, the voltage across the discharge device as above mentioned remains substantially constant, and accordingly the alternating current resistance of the gaseous discharge device is substantially zero or at least very small. It is, therefore, readily seen that a gaseous discharge device may be utilized efficiently for the transmission of alternating current signal energy.

Accordingly it is readily seen that the two gaseous discharge devices 19 and 24 which are connected in opposition between the collector electrode 20 and the base electrode 22 will provide an efficient coupling for any variation in voltage that appears at the collector electrode 20. Further, since the gaseous discharge device 19 is selected to provide a smaller voltage drop across it than the gaseous discharge device 24 provides, for example, the gaseous discharge device 19 may be a VR75 and the gaseous discharge device 24 may be a VR90 type of tube, there will remain a direct current potential difference equal to the algebraic sum of the voltage drops which in the example given will be 15 volts. This 15 volt direct current difference existing between the collector electrode 20 and the base electrode 22 is in the order of that required for presently available transistors.

Efficient and stable coupling is consequently achieved by the circuit arrangement provided by the present invention. In view of the characteristics of gaseous discharge devices, the direct current potential difference existing between the two semi-conductor devices remains substantially constant as it is desired in amplifier circuits of this type. Further due to the low alternating current impedance of gaseous discharge devices, there is provided efficient coupling between the driving stage and the driven stage.

Figure 2:
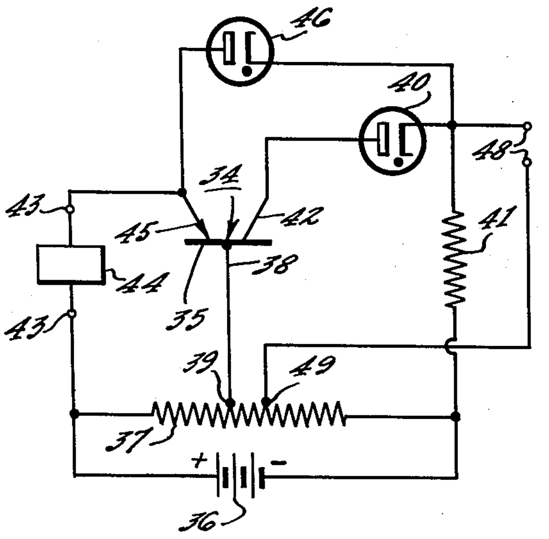
Figure 2 is a schematic circuit diagram of a semi-conductor flip-flop circuit illustrating another embodiment of the present invention.

In the schematic circuit diagram shown in Figure 2 a semi-conductor 34 of the point contact type is arranged in a flip-flop circuit substantially as described and claimed in U. S. Patent 2,533,001 issued December 5, 1950, to E. Eberhard, entitled "Flip-Flop Counter Circuit." The transistor 34 comprises a semi-conductive body 35 which may be of either N type or P type semi-conductive material such as germanium. However, with the polarities shown in Figure 2 it is assumed that the semi-conductive body 35 is of the N type material.

Bias voltages for the transistor 34 are provided from a source of direct current energizing potential illustrated as a battery 36 connected in shunt with a voltage dividing resistor 37. Bias voltages are applied to the electrodes of the transistor 34 by connecting the base electrode 38 to an intermediate tap 39 on the voltage divider resistor 37 and by means of a series arrangement of a gaseous discharge device 40 and a current limiting resistor 41 connected in series between the collector electrode 42 and the negative terminal of the battery 36. An input circuit for the transistor 34 is completed through a pair of input terminals 43 across which is connected a suitable source of input signal energy illustrated as a hollow rectangle 44. One of the input terminals 43 is connected to the emitter electrode 45 and the other of the input terminals is connected to the positive terminal of the battery 36.

As described and claimed in the above identified patent to Eberhard, a circuit of this type will operate as a flip-flop circuit when an impedance element is provided for effectively coupling the emitter electrode and collector electrode circuits, that is, when an impedance element is connected in common to the emitter and collector electrode circuits.

In accordance with the present invention, therefore, this impedance element is provided by means of a pair of diodes illustrated as a pair of gaseous discharge devices 40 and 46 which are connected in opposition between the collector electrode 42 and the emitter electrode 45. An output circuit is provided by means of a pair of output terminals 48, one of which is connected to the junction of the gaseous discharge devices 40 and 46 and the other of which is connected to a tap 49 on the voltage divider resistor 37.

Accordingly the circuit is arranged to provide bistable operation. Trigger pulses are impressed between the emitter and base electrodes from the signal source 44. The trigger pulses may be of opposite polarities as trigger pulses of a predetermined polarity will flip the circuit from one stable condition of current conduction to its other stable condition of current conduction.

The arrangement of the two gaseous discharge devices 40 and 46 in opposition connected between the collector electrode 42 and the emitter electrode 45 fulfills the requirement of a common impedance element connected between the collector and emitter electrodes. The advantage of efficient alternating current coupling between the electrodes is accomplished as above discussed in connection with Figure 1. A further advantage is obtained from the circuit in view of the fact that the voltage excursions of the circuit may be limited by the characteristics of the two gaseous discharge devices.

It has been determined as discussed by R. S. Ohl in the Bell System Technical Journal, January 1952, pages 104–121 in an article entitled "Properties of Ionic Bombarded Silicon" that by suitable treatment of semi-conductive material such as silicon a characteristic rectifier curve exhibiting a ratio of forward to reverse currents in the order of 10,000 and requiring very small voltage drop across the rectifier unit can be obtained. This characteristic of such a rectifier device may be utilized in accordance with the present invention in place of the two gaseous discharge devices 40 and 46 discussed in connection with Figure 2. Such a diode may be used in accordance with the present invention as a direct current coupling element as it exhibits a very high resistance to current flow, but at the same time as above discussed, exhibits a very low resistance to changes in current. This characteristic provides a highly efficient coupling when compared with ordinary resistors, and by operating the diode device slightly beyond the knee of its characteristic curve the diode device may be used as a direct current coupling element in semi-conductor devices as illustrated in Figure 3.

Figure 3:
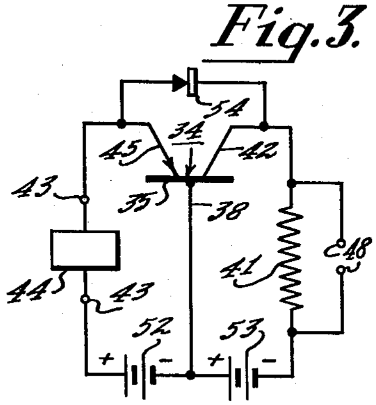
Figure 3 is a schematic circuit diagram of a semi-conductor flip-flop circuit illustrating a still further embodiment of the present invention.

The schematic circuit diagram illustrated in Figure 3 is substantially identical with the schematic circuit diagram illustrated in Figure 2 except that separate sources of direct current energizing potential are illustrated as two batteries 52 and 53 and the gaseous discharge devices 40 and 46 have been replaced by a single semi-conductor diode rectifier 54 connected between the emitter electrode 45 and the collector electrode 42. The negative terminal of the battery 53 is connected to the collector electrode 42 through a load resistor 41, and a pair of output terminals 48 are provided which are respectively connected to opposite ends of the load resistor 41. The positive terminal of the battery 52 is connected to the emitter electrode 45 through a pair of input terminals 43 across which is connected a suitable source of input signal energy represented by a hollow rectangle 44.

The operation of this circuit is substantially identical with the operation of the circuit described in Figure 2. With the present characteristics of transistors it is desirable to operate the semi-conductor diode device 54 on what is conventionally called the low voltage knee of the diode characteristic. In some instances it may be necessary to utilize more than one diode and, of course, several may be connected in series. Because of the stability of such semi-conductor diode devices, operation of the circuit is extremely dependable over either long or short periods of time, and because of the higher efficiency of such diode devices when compared with conventional resistors. Feedback may be incorporated to secure stability with the diode devices which will make the overall dependability of the circuit much better.

It is thus seen that the coupling circuit provided by the present invention enables efficient dependable operation with a minimum of circuit elements. Direct current coupling and amplification are readily obtained and the effects of drift due to variation in the potential of the source of voltage are minimized.

What is claimed is:

1. In an electronic signal translating system including a first signal circuit terminal, a second signal circuit terminal, means providing a point of fixed reference potential for said system, and a signal translating transistor having electrodes connected with said terminals, a coupling network for conveying signal variations from said first terminal to said second terminal comprising a pair of unilateral conducting devices connected in opposition between said terminals in said system, the first of said devices being characterized by providing a voltage drop thereacross which exceeds the voltage drop appearing across the second of said devices, and a source of direct current energizing potential connected between the junction of said devices and said point of fixed reference potential for providing energizing potential for said system.

2. In an electronic signal translating system as defined in claim 1, wherein said pair of unilateral conducting devices comprise gaseous discharge devices.

3. In an electronic signal translating system as defined in claim 1, wherein said pair of unilateral conducting devices comprise a pair of diode rectifier devices.

4. An electronic signal translating circuit comprising, a semi-conductor device including a semi-conductive body, a base electrode, an emitter electrode and a collector electrode contacting said body, means for applying potentials to said electrodes, means for impressing trigger pulses between two of said electrodes, and a semi-conductor diode device common to both said emitter and collector electrodes, thereby to render said emitter electrode responsive to changes of the current flowing through and changes of the voltage existing at one of the other of said electrodes.

5. An electronic signal translating circuit comprising, a semi-conductor device including base, emitter and collector electrodes, means connected for applying potentials to said electrodes, means for impressing trigger pulses between two of said electrodes, and a unilaterally conducting device connected between said collector and emitter electrodes to render said emitter electrode responsive to changes of the current flowing through and changes of the voltage existing at one of the other of said electrodes.

6. An electronic signal translating circuit comprising, a semi-conductor device including a semi-conductive body, a low resistance base electrode, a small-area emitter electrode and a small-area collector electrode in contact with said body, means for applying potentials to said electrodes, means for impressing trigger pulses on one of said electrodes, and an impedance element effectively coupling said emitter and collector electrodes, said impedance element comprising a pair of gaseous discharge devices connected in opposition, whereby one of said small-area electrodes is rendered responsive to changes of the current flowing through and changes of the voltage existing at one of the other of said electrodes.

7. An electronic signal translating circuit comprising, a semi-conductor device including a semi-conductive body, a low resistance base electrode, a small-area emitter electrode and a small-area collector electrode in contact with said body, means for applying potentials to said electrodes, means for impressing trigger pulses on one of said electrodes, and a pair of gaseous discharge devices connected in opposition between said collector and emitter electrodes to render one of said small-area electrodes responsive to changes of the current flowing through and changes of the voltage existing at one of the other of said electrodes.

8. A semi-conductor circuit comprising in combination, a pair of semi-conductor devices each including a base electrode, an emitter electrode and a collector electrode, means for applying potentials to said electrodes, means for impressing input signals between the base electrode and the emitter electrode of the first of said pair of semi-conductor devices, means for coupling the collector electrode of the first of said pair of semi-conductor devices to the base electrode of the second of said pair of semi-conductor devices and providing a direct current conductive path therebetween comprising a pair of diode devices connected in opposition, an impedance element connected between the junction of said pair of diode devices and said means for applying operating potentials, and an output circuit coupled between the collector electrode of the second of said pair of semi-condoctor devices and said means for applying operating potentials.

9. The combination as defined in claim 8, wherein said pair of diode devices comprises a pair of semi-conductor devices each being characterized by providing a voltage drop different from the other.

10. The combination as defined in claim 8, wherein said pair of diode devices comprises a pair of gaseous discharge devices each being characterized by providing a voltage drop different from the other.

References Cited in the file of this patent

UNITED STATES PATENTS

| | | |
|---|---|---|
| 2,310,092 | Knowles | Feb. 2, 1943 |
| 2,320,790 | Moyer | June 1, 1943 |